United States Patent [19]

Sumi

[11] Patent Number: 5,000,814

[45] Date of Patent: Mar. 19, 1991

[54] FILM PEELING APPARATUS HAVING FLUID INJECTION DEVICE

[75] Inventor: Sigeo Sumi, Saitama, Japan

[73] Assignee: Somar Corporation, Tokyo, Japan

[21] Appl. No.: 414,636

[22] Filed: Sep. 29, 1989

Related U.S. Application Data

[63] Continuation of Ser. No. 17,415, Feb. 24, 1987, abandoned.

[30] Foreign Application Priority Data

Feb. 24, 1986 [JP]  Japan .................................. 61-38879

[51] Int. Cl.$^5$ ............................................. B32B 31/16
[52] U.S. Cl. .................................... 156/344; 156/584
[58] Field of Search .................... 156/344, 584; 221/71

[56] References Cited

U.S. PATENT DOCUMENTS

| 2,491,282 | 12/1949 | Rowe | 156/584 |
| 3,998,977 | 12/1976 | Rabeler | 426/639 X |
| 4,594,748 | 6/1986 | Warfvinge | 134/15 X |
| 4,724,032 | 2/1988 | Kay | 156/584 X |

*Primary Examiner*—Frank Spear
*Attorney, Agent, or Firm*—Sughrue, Mion, Zinn, Macpeak & Seas

[57] ABSTRACT

A film peeling apparatus for peeling a film stuck onto a base comprises a film raising device for raising one end portion of the film and a fluid injection device for sending a jet of fluid to the portion of the film raised by the film raising device, the fluid injection device comprising a fluid injection nozzle for injecting a jet of fluid and a nozzle guide member for guiding the fluid injection nozzle so that the fluid is injected from the fluid injection nozzle directly toward the portion of the film raised.

9 Claims, 10 Drawing Sheets

FILM PEELING APPARATUS HAVING FLUID INJECTION DEVICE

This is a continuation of application Ser. No. 07/017,415, filed Feb. 24, 1987 now abandoned.

BACKGROUND OF THE INVENTION

This invention relates to a film peeling technique, and more particularly to a technique which can be effectively employed to peel a protective film from the substrate or panel by means of a fluid injection device.

In a printed circuit board used in an electronic device such as a computer, a predetermined circuit is formed with copper on one or both sides of an insulated substrate or panel.

A printed circuit board of this type can be manufactured as follows: First, a laminate consisting of a photosensitive resin (photo-resist) layer and a translucent resin film (protective film) for protecting the photosensitive resin layer is thermally formed on the conductive layer of the insulated substrate under pressure. Thereafter, a circuit pattern film is laid over the laminate thus formed, and the photosensitive resin layer is exposed to light through the circuit pattern film and the translucent resin film for a predetermined period of time. After the translucent resin film is peeled off, the photosensitive resin layer thus exposed to light is subjected to developing to form an etching mask pattern. Thereafter, the unnecessary parts of the conductive layer are removed by etching, to obtain a printed circuit board having the predetermined circuit pattern.

In the above-described printed circuit board manufacturing method, in developing the photosensitive resin layer it is necessary to peel the translucent resin film off.

An object of the present invention is to obtain a film peeling apparatus which can efficiently and accurately peel the thin film from a panel.

The above-described object and other objects of the invention and novel features of the invention will become more apparent when read the following description in conjunction with the accompanying drawings.

SUMMARY OF THE INVENTION

In order to achieve the above object, according to the present invention, a film peeling apparatus has a film raising device for raising one end of a film stuck onto a base and a fluid injection device for peeling off the film from the base by supplying a jet of fluid thereto. The fluid injection device comprises a fluid injection nozzle for injecting the fluid to the end of the film raised by the film raising device and nozzle guide member for guiding the fluid injection nozzle so that the jet of fluid is injected from the fluid injection nozzle toward the position where the end of the film is raised.

According to the present invention, the jet of fluid injected from the injection nozzle can be directly supplied to the film raising position, in accordance with a thickness of the base. Furthermore, the front end of the injection nozzle can be positioned as close to the film raising position as possible. As a result, the film can be peeled off with certainty and efficiency.

Moreover, since it becomes possible to let the front end of the fluid injection nozzle face the film raising position in accordance with a thickness of the base, the front end of the fluid injection nozzle can be prevented from contacting with the base, so that the base and the nozzle can be prevented from being damaged.

DETAILED DESCRIPTION OF THE PREFERRED EMBODIMENT

This invention will be described in detail with reference to an apparatus for peeling a protective film from a printed circuit board, to which the technical concept of the present invention is applied.

In the accompanying drawings, like parts are designated by like reference numerals or characters.

Figure 1:
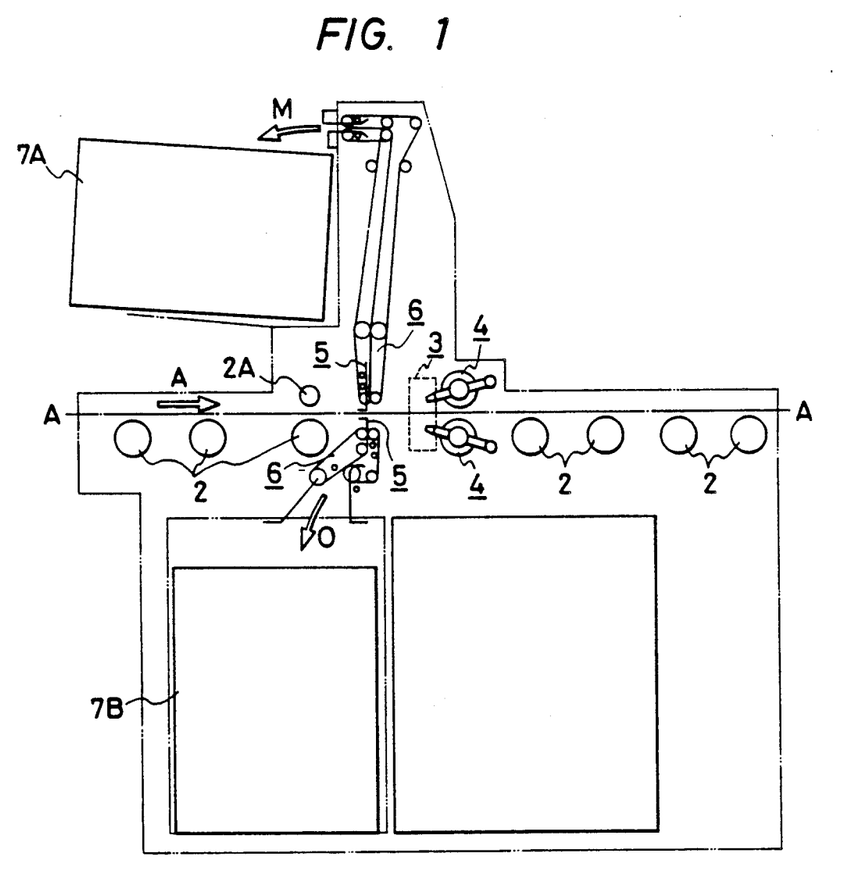
FIG. 1 is a side view showing a schematic construction of an apparatus for peeling a protective film from a board, according to the present invention.

FIG. 1 is a schematic side view showing a construction of an apparatus for peeling a protective film on a board for a printed circuit board, according to the present invention.

Figure 2:
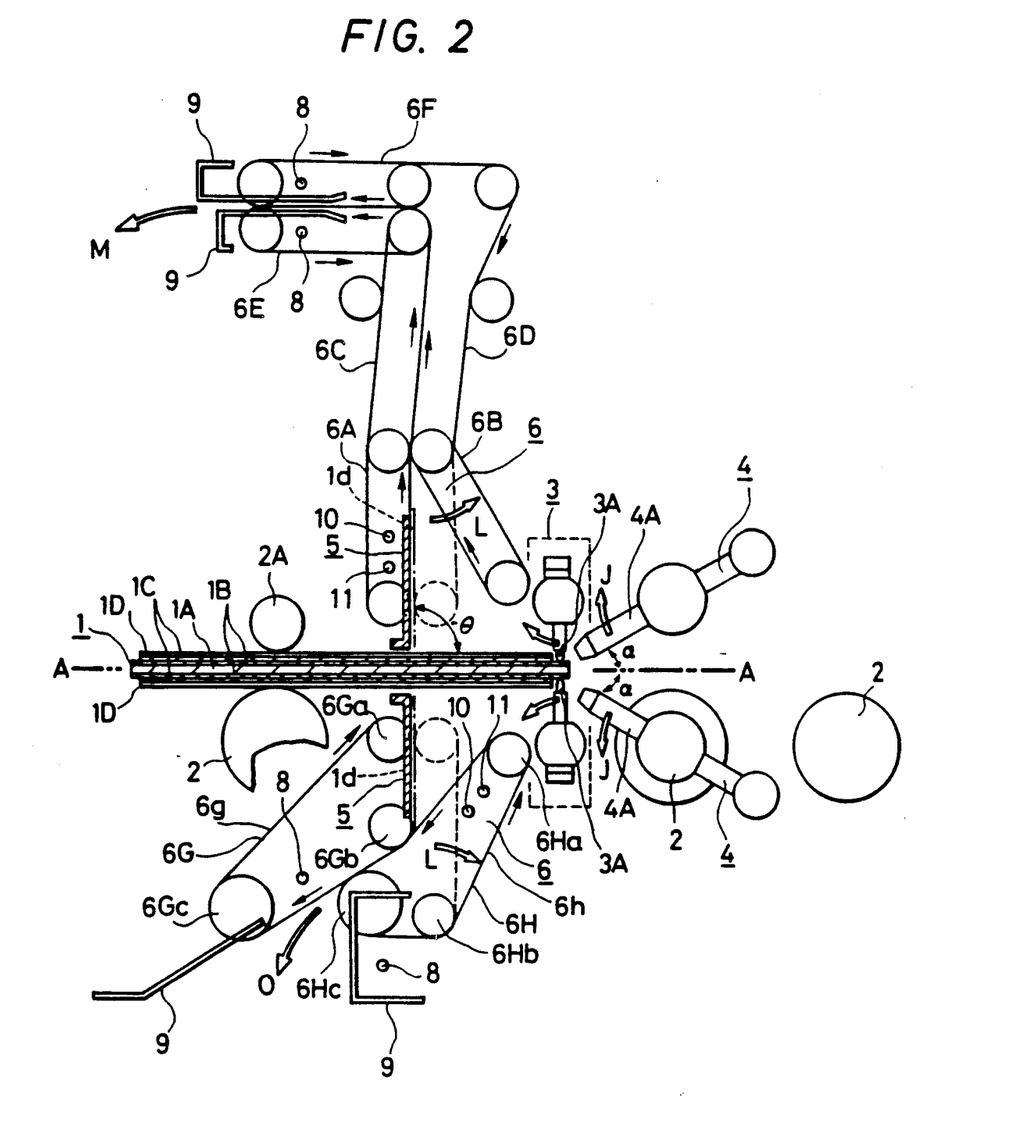
FIG. 2 is an enlarged side view of the principal portion of FIG. 1.

FIG. 2 is an enlarged side view of the principal portion of FIG. 1.

According to the present invention, the mechanism for conveying a board in the film peeling apparatus mainly comprises conveyance driving rollers 2 for conveying a board 1, as shown in FIGS. 1 and 2.

In the above-described conveyance mechanism, a projected press mechanism 3, a fluid injection mechanism 4, a peel angle setting plate (auxiliary peeling plate) 5 and a film delivery mechanism (film conveyance apparatus) 6 are arranged along the conveyance path A—A.

In the board 1, a conductive layer 1B of copper or the like is formed on one or both sides of an insulated substrate 1A, as shown in FIG. 2. A laminate consisting of a photosensitive resin layer 1C and a translucent resin film (or a protective film) 1D is thermally formed on the conductive layer 1B of the board 1 under pressure. The photosensitive resin layer 1C has been exposed to light in a predetermined circuit pattern.

The conveying rollers 2 are so designed as to convey the board 1 in the direction of the arrow A, as shown in FIG. 1.

Figure 3:
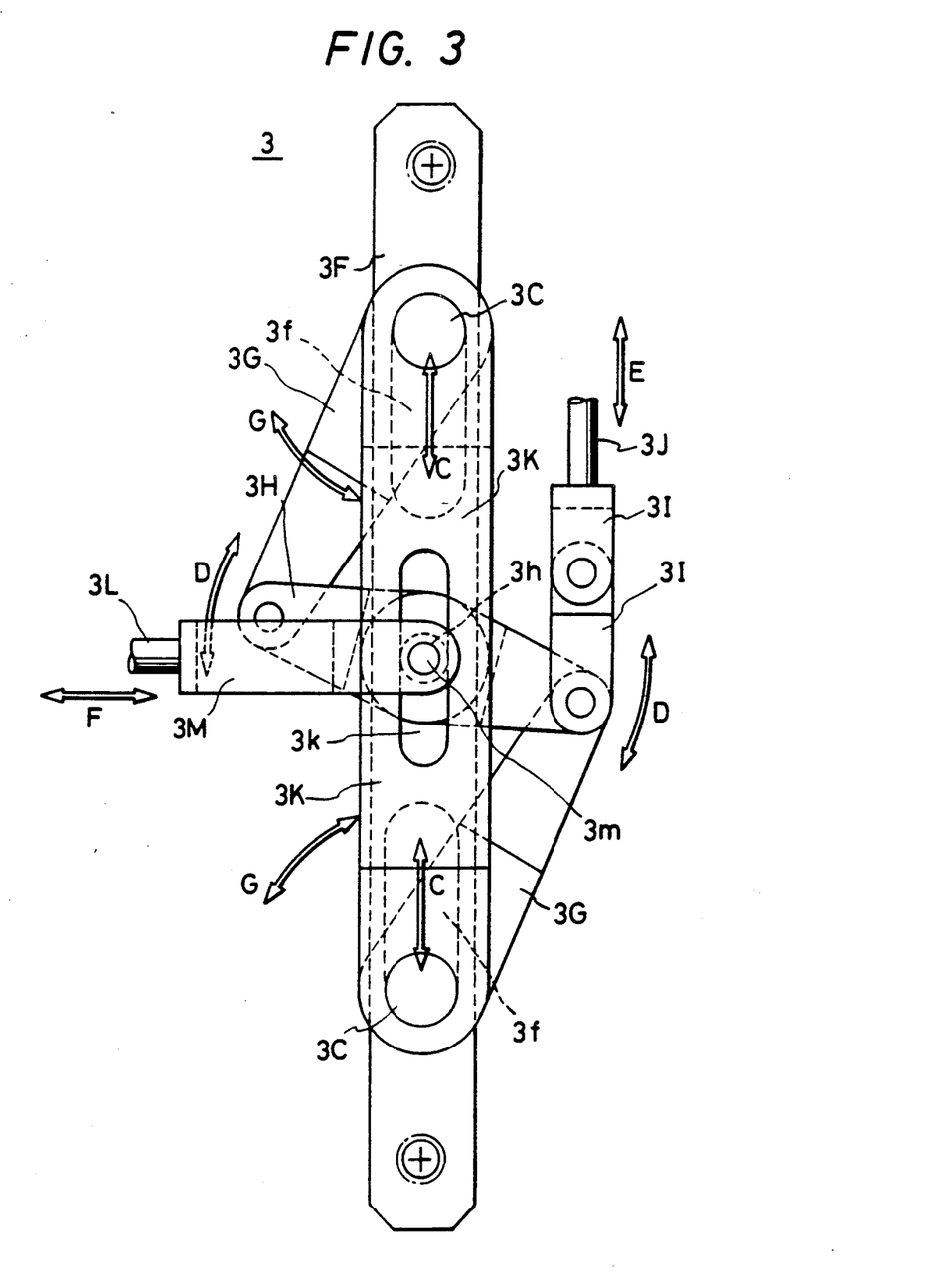
FIG. 3 is a view showing the projected press mechanism of FIGS. 1 and 2.
Figure 4:
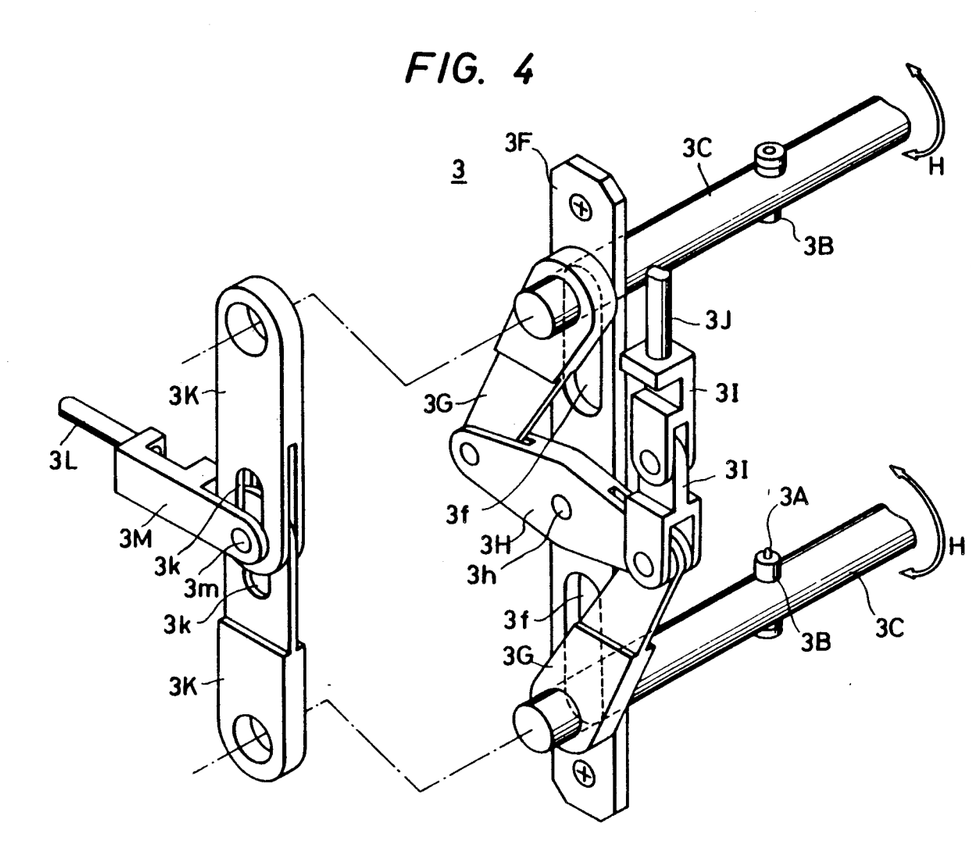
FIG. 4 is an exploded view of FIG. 3.
Figure 5:
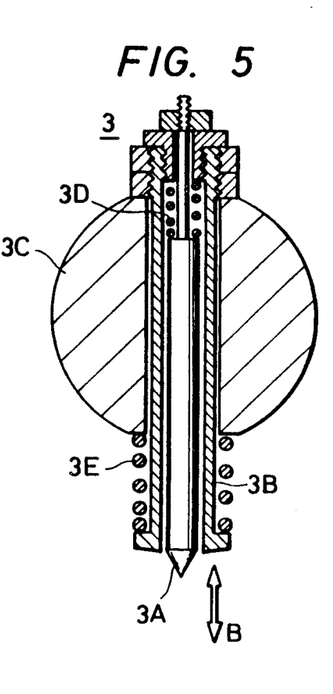
FIG. 5 is a partial sectional view of the projected press member of FIG. 4.

The projected press mechanism 3 is constructed as shown in FIGS. 3 to 5.

The projected press mechanism 3 comprises a plurality of projected press members 3A installed on both sides of the board 1. The projected press members 3A are arranged in the direction across the conveyance direction (the crosswise or transverse direction of the printed circuit board 1). The projected press member 3A is needle-shaped as shown in FIG. 5 and formed so that the end of the laminated body comprised of the photosensitive resin layer 1C and the translucent resin film 1D is pressed by the front end of the projected press member 3A. The projected press member 3A is arranged so that the press member is not entered into the interface between the conductive layer 1B and the photosensitive resin layer 1C when the projected press member 3A presses the end of the laminated body. An tip end angle of the projected press member 3A is about 60 degrees. The projected press members 3A arranged opposite to each other are supported by projected press member supporting rotary shafts 3C through holders 3B, respectively. The holder 3B is installed in such a manner as to slide along the through-hole (which is not supplied with a numeral or character) of the projected press member supporting rotary shaft 3C.

The resilient member 3D is installed between the projected press member 3A and the holder 3B. The resilient member 3E having a resiliency which is the same with or different from that of the resilient member 3D is installed between the holder 3B and the projected press member supporting rotary shaft 3C. The resilient members 3D and 3E are installed in the direction of an arrow B, and act in the direction close to the printed circuit board 1. Accordingly, the position of the front end of the projected press member 3A with respect to the projected press member supporting rotary shaft 3C can be changed by an applied pressure in the direction of the arrow B.

One end (or both ends) of the projected press member supporting rotary shaft 3C is, as shown in FIGS. 3, 4, rotatably coupled to one end of a moving arm member 3G through a guide slit 3f made in a guide member 3F. The guide member 3F is fixed to the apparatus body with machine screws and the like (not shown). The guide slit 3f is formed in the direction (of an arrow C) approaching to or departing from the board 1 so as to guide the projected press member supporting rotary shaft 3C, i.e., the projected press member 3A in the direction of an arrow C.

The other end of each moving arm member 3G is rotatably secured to one of the opposite ends of a rotary arm member 3H secured rotatably on the rotary shaft 3h in the direction of an arrow D. The rotary arm member 3H is capable of moving each moving arm member 3G in the longitudinal direction of an arrow C.

The guide member 3F, the moving arm member 3G and the rotary arm member 3H for guiding the projected press member supporting rotary shaft 3C constitute the link mechanism of the projected press mechanism 3 for causing the projected press members 3A installed on both sides of the printed circuit board 1 to move close to and away from each other, by the movement of the shaft 3J of the driving source for both side use in the direction of an arrow E. The shaft 3J is coupled to one end of the rotary arm member 3H through an arm coupling member 3I. The members constituting the link mechanism each are prepared from material relatively hardly deformable against external force, such as iron, aluminum alloy and rigid plastics. As a driving source a pneumatic or hydraulic cylinder, or a solenoid can be used. The shaft 3J is not limited to be coupled to one end of the rotary arm member 3H. The shaft 3J may be coupled to one end of the moving arm member 3G through the arm coupling member 3I.

By thus coupling the projected press member 3A to the driving source by means of the link mechanism, the projected press members 3A installed on both sides of the board 1 each may be caused to contact with or depart from the surface of the board 1. The projected press member 3A moves in the direction of the arrow C. In other words, the link mechanism is capable of driving the projected press members 3A on both sides by one driving source for both side use. Therefore, it is unnecessary to provide individual driving sources for driving the projected press members 3A on each side of the board 1.

Material forming the guide member 3F, the moving arm members 3G and the rotary arm member 3H constituting the link mechanism are rigid. The operating range of them is defined by the guide slit 3f and the rotary shaft 3h. Therefore, the projected press members 3A on both sides of the board 1 can be controlled accurately, with the operating amount and operating time of the projected press members 3A on both sides being almost equal to each other.

The link mechanism for coupling the projected press member 3A and the driving source for both side use can be made simpler in construction than what is formed with a rack and pinion or gear mechanism, since the number of parts required is smaller and each part is simpler in configuration.

A projected press member rotating arm member 3K is installed at the end (or both ends) of each projected press member supporting rotary shaft 3C linked with the moving arm member 3G in such a manner that one end of the projected press member rotating arm member 3K is fixed to the end of the projected press member supporting rotary shaft 3C. At the other end of each projected press member rotating arm member 3K, is provided a slit 3k. The shaft 3m of the arm coupling member 3M connected to the shaft 3L of the driving source for both side use is passed through the slit 3k. In other words, the projected press member rotating arm member 3K is coupled to the shaft 3L of the driving source for both side use through the coupling arm member 3M. As the driving source for both side use, a driving source similar to what is applied to the above-described link mechanism may be used.

When the shaft 3L moves in the direction of an arrow F, the projected press member rotating arm member 3K rotates in the direction of the arrow G and the projected press member supporting rotary shaft 3C rotates in the direction of an arrow H, so that the projected press member 3A presses the end of the laminated body. In other words, the projected press member rotating arm member 3K and the arm coupling member 3M constitute the projected press member pressing mechanism of the projected press mechanism 3.

The projected press member pressing mechanism thus constructed is capable of operating the projected press members 3A on both sides of the printed circuit board 1 with one driving source and is capable of controlling the operating quantity and time thereof accurately, as in the case of the link mechanism for moving together and away the projected press members 3A.

Moreover, the projected press member pressing mechanism can simplify the coupling mechanism for coupling the projected press member 3A and the driving source for dual side use.

The projected press mechanism 3 thus comprises the projected press members 3A, the link mechanism for causing the projected press member 3A to near and depart from the board 1, and the projected press member pressing mechanism for pressing the end of the laminated body with the projected press member 3A.

Although the link mechanism or projected press member pressing mechanism and the driving source for dual side use are installed on one side of the projected press member supporting rotary shaft 3C, they may be installed on both sides according to the present invention.

Referring to FIGS. 1 through 7, the operation of the projected press mechanism 3 will be described briefly.

A thin film end detector (not shown) is used first. As a thin film end detector, touch sensor for electrically detecting the end of a thin film laid on the board 1 or a photosensor for detecting the same optically can be used.

When the end of a thin film stuck onto the board is detected by the thin film end detector, a pinch roller 2A shown in FIGS. 1 and 2 is pressed against the board 1 using a press means (not shown), and the conveyance of the board 1 is temporarily stopped by the pinch roller 2A and a conveyance driving roller 2. At this time, the board is prevented from moving, since material such as rubber having a high coefficient of friction is attached to the outer peripheral surface of the conveyance driving roller 2 opposite to the pinch roller 2A. Therefore, the conveyance of the board 1 is stopped securely, so that the board 1 is fixed.

Figure 6:
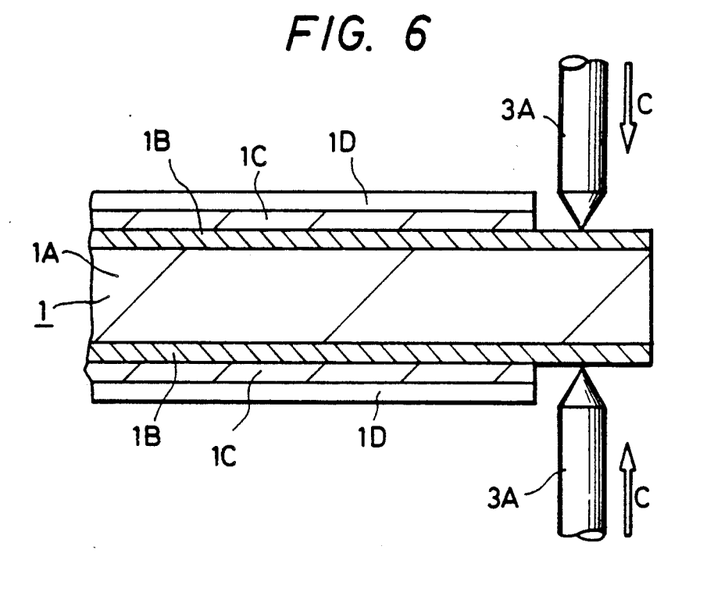
FIGS. 6 and 7 are sectional views of the principal portions of the board of FIG. 2.

The shaft 3J of the driving source for dual side use coupled to the link mechanism is moved in the direction of an arrow E (upward in the FIG. 3). This operation allows the link mechanism constituted by the rotary arm member 3H, the moving arm member 3G and the guide member 3F to operate, so that the projected press member supporting rotary shaft 3C is caused to move in the direction of the arrow C. As a result of which each of the front ends of the projected press members 3A on both sides of the printed circuit board 1 contacts with the surface of the conductive layer 1B at the end of the laminated body as shown in FIG. 6. The tip end of the projected press member 3A is contacted with the surface of the conductive layer 1B with a suitable pressing force such that the resilient member 3D (3E) may have energy.

Figure 7:
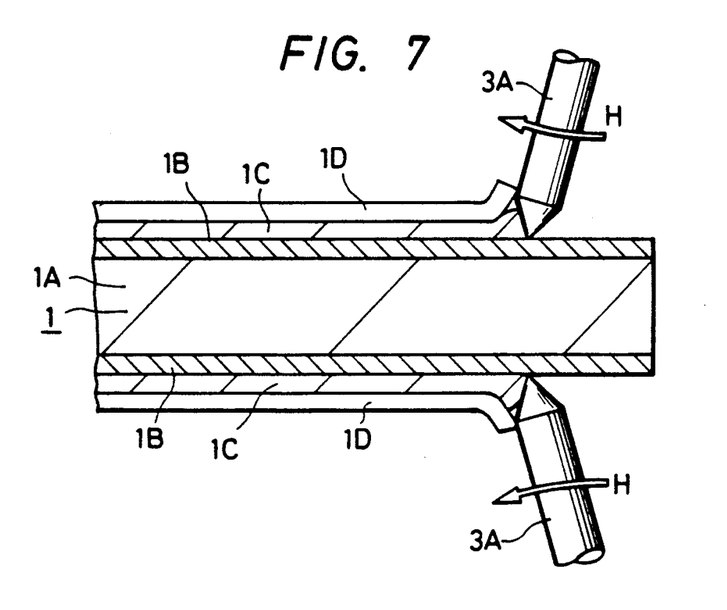

While the projected press member 3A is in contact with the conductive layer 1B, the shaft 3L of the driving source for dual side use coupled to the projected press member pressing mechanism is moved in the direction indicated by an arrow F (to the left in the FIG. 3). This movement of the shaft 3L causes the projected press member pressing mechanism comprising the projected press member rotating arm member 3K and the arm coupling member 3M to operate, so that the projected press member supporting rotary shaft 3C is rotated in the direction of the arrow H. By the rotation of the projected press member supporting rotary shaft 3C, the front ends of the projected press members 3A on both sides of the board 1 press the end of the laminated body, as shown in FIG. 7.

The end of the laminated body having the photosensitive resin layer 1C and the translucent resin film 1D is pressed by the projected press members 3A of the projected press mechanism 3, so that a part of the translucent resin film 1D is peeled off from the photosensitive resin layer 1C, and a gap is produced at the interface between the film 1D and the layer 1C, as will be described hereinafter. The photosensitive resin layer 1C is prepared from material softer than that for the translucent resin film 1D. Therefore, the film 1C is apt to be subjected to plastic deformation by the pressure applied by the projected press member 3A than the layer 1D. Therefore, first, only the film 1C is deformed. The adhesion of the layer 1D to the film 1C reduces, before the layer 1D is deformed. Therfore, a gap is formed between the film 1C and the layer 1D.

Moreover, the end of the translucent resin film 1D can be peeled off by the needle-shaped projected press member 3A which is simple in configuration.

Since the projected press member 3A is installed in the conveyance path of the board, the end of the translucent resin film 1D can automatically be raised.

A plurality of projected press members 3A are provided in the direction crossing (crosswise direction) the conveyance direction of the printed circuit board 1 according to this embodiment, in order that the film of the laminated body which is heat bonded distortedly on the printed circuit board 1 can also be raised surely. However, the present invention is not limited to the above structure. In other words, the projected press mechanism 3 may be so arranged as to have only one projected press member 3A on the respective sides of the board 1, if the end portion of the photosensitive resin layer 1C and the translucent resin film 1D is pressed so that the film 1D can be surely raised.

Although the projected press members 3A are arranged in the direction (crosswise direction) crossing the conveyance direction of the board 1 according to this embodiment, the projected press members 3A may be arranged at the end portions or portions close to the corner of the laminated body, in the same direction as the conveyance direction of the board 1. In this case, the nozzle 4A of the fluid injection mechanism 4 is set close to the projected press member 3A.

The projected press member pressing mechanism of the projected press mechanism 3 according to this embodiment is arranged in the form of the link mechanism. However, the projected press member pressing mechanism according to the present invention may be so constructed that the board 1 is carried slightly by the rotation of the conveyance driving roller 2 (or the pinch roller 2A) with the projected press member 3A being in contact with the surface of the board 1 at the end of the laminated body, and that the end of the laminated body is pressed by the projected press member 3A. That is, the projected press member pressing mechanism may be constructed by a conveyance mechanism.

Moreover, the cross section of the projected press member supporting rotary shaft 3C in the direction across the axis of the shaft according to the present invention may be square, in order to increase the accuracy of processing the through-hole into which the holder 3B is fitted and in order to facilitate the processing.

The fluid injection device 4 is so constructed as shown in FIGS. 1, 2, 8 and 9. The fluid injection device 4 has a fluid injection nozzle 4A for sending a jet of pressurized fluid, e.g., a gas such as air and inactive gas and a liquid such as water so as to peel off the translucent resin film 1D. The jet of fluid is injected from the fluid injection nozzle 4A directly to the gap formed between the photosensitive resin layer 1C of the base 1 and the translucent resin film 1D partly raised from the layer 1C. In other words, the fluid is immediately directed to the raising position of the translucent resin film 1D caused to be raised by the projected press member 3A. The number of the fluid injection nozzles 4A is determined, corresponding to the number of the projected press members 3A.

Figure 8:
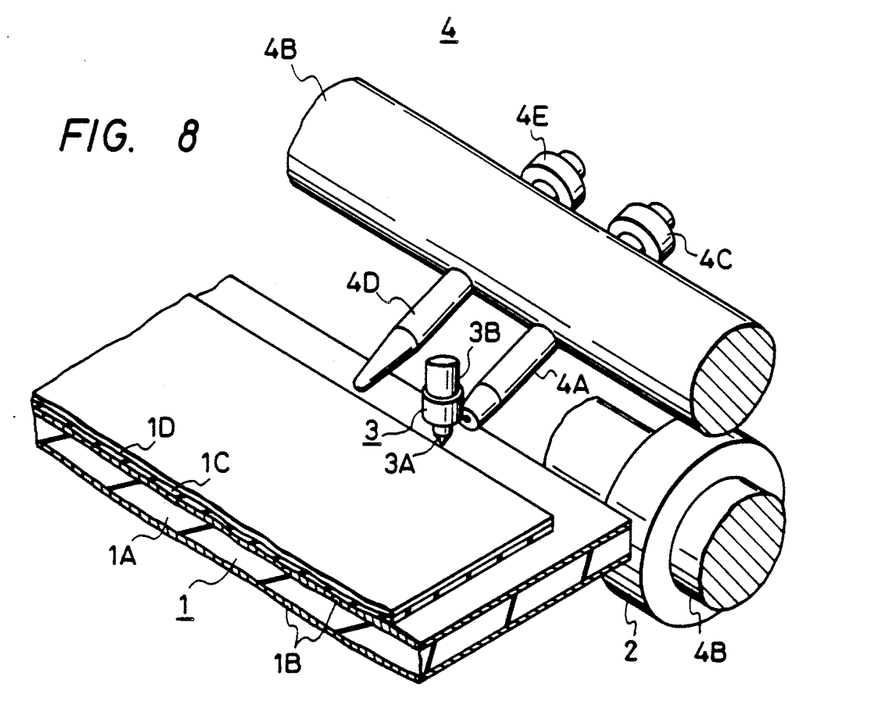
FIG. 8 is a perspective view of a principal portion of the fluid injection device of FIGS. 1 and 2.
Figure 9:
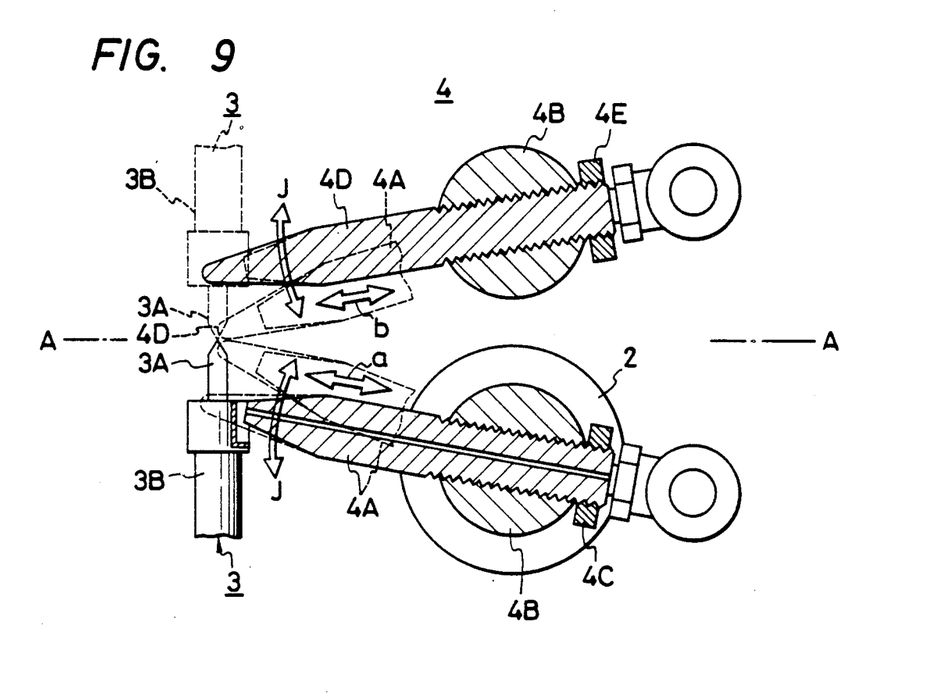
FIG. 9 is a partial sectional view of the fluid injection device of FIGS. 1 and 2.

The fluid injection nozzle 4A is, as shown in FIGS. 8 and 9, fixed to a nozzle support rotary shaft 4B with a fixing nut 4C. The fluid injection nozzle 4A has a screw portion, and is screwed into a hole of the nozzle support rotary shaft 4B so that the position of the fluid injection nozzle 4A can be adjusted slightly in the direction of an arrow a relative to the nozzle support rotary shaft 4B. The fluid injection nozzle 4A is so arranged that its set angle is changeable in the direction of an arrow J according to the rotation of the nozzle support rotary shaft 4B.

A fluid injection nozzle guide member 4D is installed close to the fluid injection nozzle 4A on the nozzle support rotary shaft 4B. The nozzle guide member 4D makes the fluid injection nozzle 4A, in its fluid injection direction, face the film raising position. The nozzle guide member 4D moves the fluid injection nozzle 4A so that the fluid is injected from the nozzle 4A directly toward the film raising position. The fluid injection nozzle 4A is positioned downstream of the film raising position in a base conveyance direction. The nozzle guide member 4D guides the fluid injection nozzle 4A so that an angle α formed from a surface of the base to a fluid injection direction of the nozzle 4A may be acute, as shown in FIG. 2.

The nozzle guide member 4D is fixed to the nozzle support rotary shaft 4B with a fixing nut 4E as in the case of the fluid injection nozzle 4A. The nozzle guide member 4D has a male screw portion. The nozzle guide member 4D is screwed into a hole of the nozzle support rotary shaft 4E so that the position of the nozzle guide member 4D can be adjusted slightly in the direction of an arrow b relative to the nozzle support rotary shaft 4B.

The front end of the fluid injection nozzle 4A on the fluid injection side is set close to the projected press member 3A, i.e., at the film raising position by the fluid injection nozzle guide member 4D when the jet of fluid is sent out. In other words, the fluid injection nozzle 4A thus set is capable of sending the jet of fluid to the position where the translucent resin film 1D is raised, almost simultaneously when or after the end of the film is raised by the projected press member 3A. Moreover, the fluid injection nozzle 4A can be set as close to the film raising position as possible by the nozzle guide member 4D in accordance with a thickness of the base 1, so that the pressure of the injected fluid can be increased to ensure that the translucent resin film 1D is peeled off. The peeling effect is improved.

As described above, the fluid injection nozzle 4A can be set close to the film raising position when the jet of fluid is sent out. Furthermore, by the rotation of the nozzle support rotary shaft 4B in the direction of an arrow J, the fluid injection nozzle 4A can be moved back to the position where the nozzle 4A is prevented from contacting the board 1 before and after the fluid is injected. Since the fluid injection nozzle 4A can be moved back, the photosensitive resin layer 1C and the nozzle 4A are prevented from contacting with each other while the board is conveyed after the translucent resin film 1D has been peeled off from the board, so that the layer 1C and the nozzle 4A are prevented from being damaged.

Since the nozzle guide members 4D are so arranged as to hold the base 1 between them, they are capable of reforming the base whose film raising portion is distorted and accurately making the fluid injection direction of the fluid injection nozzles 4A directed to the film raising position.

The rotation of the nozzle support rotary shaft 4B, that is, the rotation of the fluid injection nozzle 4A in the direction of an arrow J can be performed with a mechanism similar to what is used for pressing the projected press member of the projected press device 3. The rotation of the fluid injection nozzle 4A is detected electrically or optically by a detection device (not shown), and is controlled by a signal produced from the detection device. The rotation of the fluid injection nozzle 4A may be controlled interlockingly with the movement of the projected press member 3A.

Figure 10:
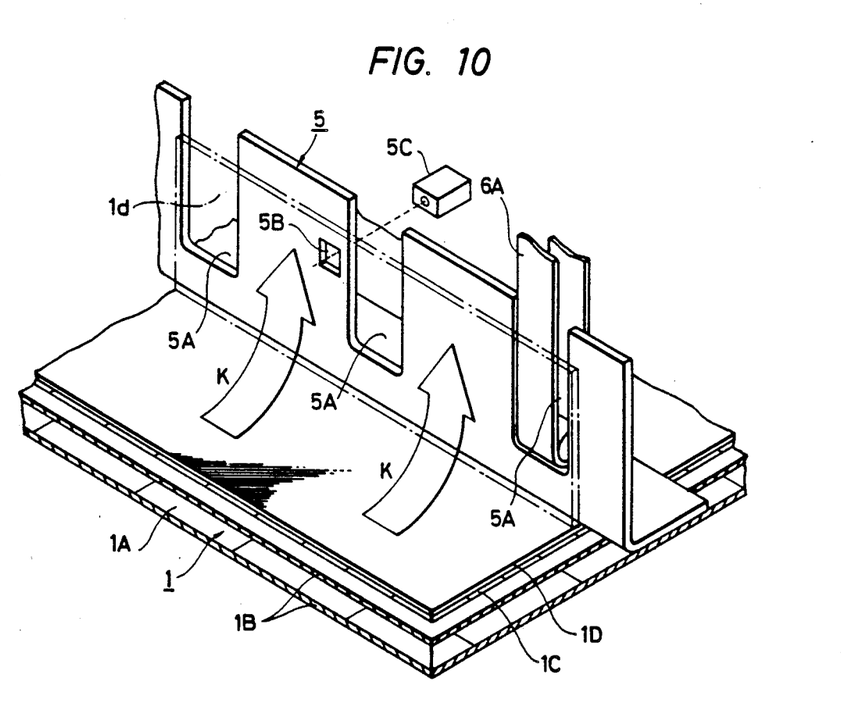
FIG. 10 is a perspective view of the principal portions of the peel angle setting plate of FIGS. 1 and 2.

As shown in FIGS. 2 and 10, the front end 1d of the translucent resin film in the conveyance direction thereof peeled off by the fluid injection mechanism 4 is stuck to the peel angle setting plate (auxiliary peeling plate) 5 by the fluid pressure, and the peel angle θ for the peel position and direction is set. The translucent resin film 1d is shown by one-dot-and-dash line of FIGS. 2 and 8. The peel angle θ is the angle of the translucent resin film 1d pulled up with respect to the translucent resin film 1D stuck onto the board 1 (or the board 1). The peel angle θ is set to about 90 degrees.

The peel angle setting plate 5 is installed such that the front end of the peel angle setting plate 5 (peel position) on the peeling side is apart from the translucent resin film 1D stuck to the printed circuit board 1 and such that the setting plate may not brush with the resin film 1D to prevent the photosensitive resin layer 1C from being damaged or broken down. Furthermore, the peel angle setting plate 5 is movably arranged so that the end of the peel angle setting plate 5 sticks tightly to the translucent resin film 1D during the time the fluid is being injected, for preventing reduction of the peel effect, since the reduction of the peel effect is caused if the fluid is blown through between the end of the peel angle setting plate 5 and the board. Moreover, the front end of the peel angle setting plate 5 is in a circular arc form with its curvature radius being small, that is, its curvature radius being less than 3 mm.

Moreover, the peel angle setting plate 5 has its front end located closer to the printed circuit board 1 than the thin film delivery mechanism 6. The peel angle setting plate 5 extends in the peel direction (film delivery direction) with a predetermined length. The peel angle setting plate 5 extends in a crosswise direction of the peeled film crossing the film peeling direction with its length being enough to cover the width of the conveyance path of the printed circuit board 1 or the fluid injection width in the peel direction. In other words, the peel angle setting plate 5, as the direction of the fluid blown is shown by an arrow K in FIG. 10, is capable of increasing the peeling effects, by preventing the fluid from being blown to the rear side of the peel angle setting plate 5 and is capable of increasing the adhesion of the peeled translucent resin film 1d to the peel angle setting plate 5.

The peel angle setting plate 5 is fixed to the apparatus body at a predetermined position apart from the nozzle 4A in the fluid flowing direction.

The peel angle setting plate 5 is able to stabilize the peel position and add uniform peeling force to the translucent resin film 1D. Accordingly, the peel angle setting plate 5 prevents the peel position from shifting when the translucent resin film 1D is being peeled off and prevents peel stress from distorting and the photosensitive resin layer 1C from being damaged or broken.

The peel angle $\theta$ of the peel angle setting plate 5 with respect to the translucent resin film 1D may be set variable within the range of obtuse to right angle, according to changes in conditions, such as change of material for the translucent resin film 1D, change of the fluid pressure in the fluid spray mechanism 4, etc. Moreover, the peel angle setting plate 5 may be so arranged as to be movable, in corresponding to the thickness of the printed circuit board 1, the photosensitive resin layers 1C or the translucent resin films 1C. The peel angle setting plate 5 may be moved or transferred by an air or hydraulic cylinder.

The peeling angle setting plate 5 is provided with a through-hole 5B at the position to which the translucent resin film 1d peeled is stuck. The through-hole 5B is used for detecting the peeled film. The through-hole 5B is arranged so that the detection light to be detected by an optical sensor 5C can pass through the hole 5B. As a result, it is made clear whether or not the translucent resin film 1d peeled is surely present on the peeling angle setting plate 5. In the case where the presence of the translucent resin film is unconfirmed through the aforesaid detection and there is a possibility that the film may not have been peeled properly, the base is discharged from the conveyance passage, after the detection is performed.

Figure 11:
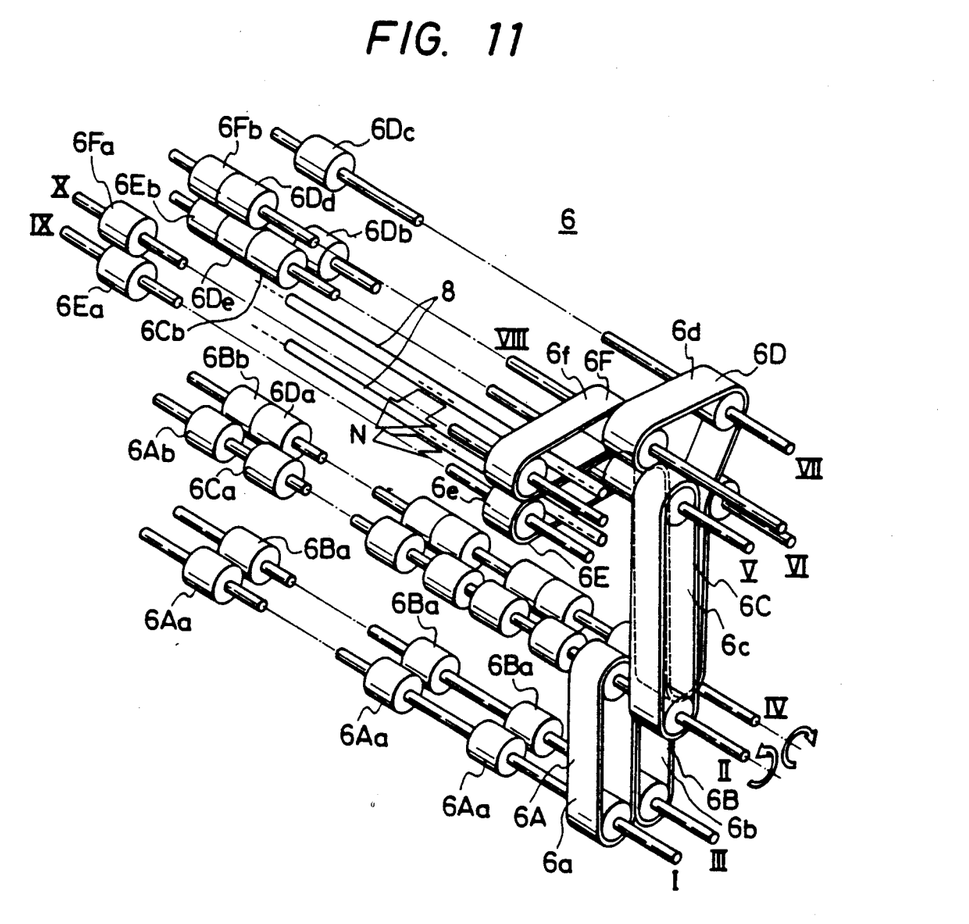
FIG. 11 is an expanded exploded perspective view of the film conveyance mechanism of FIGS. 1 and 2.

The translucent resin film 1d stuck to the peel angle setting plate 5 by the fluid injection mechanism 4 is, as shown in FIGS. 1, 2 and 11, carried out by the film carrying out mechanism (thin film conveyance mechanism) 6 while the thin film is being peeled off.

The thin film conveyance mechanism 6 comprises an upper conveyor belt mechanism and a lower conveyor belt mechanism installed on both sides of the printed circuit board 1, respectively.

The upper conveyor belt mechanism consists of, as shown in FIG. 11 in detail, fixed conveyor belts 6A, 6C, 6D, 6E, 6F and moving conveyor belts 6B.

The fixed conveyor belt 6A consists of a roller 6Aa supported by a driven shaft I, a roller 6Ab supported by a driving shaft II and a belt 6a wound on the rollers 6Aa, 6Ab.

The moving conveyor belt 6B consists of a roller 6Ba supported by a driven shaft III, a roller 6Bb supported by a driving shaft IV and a belt 6b wound on the rollers 6Ba, 6Bb. The moving conveyor belt 6B is rotated on the driving shaft IV in the direction of an arrow L as shown in FIG. 2. The moving conveyor belt 6B facilitates the adhesion of the peeled translucent resin film 1d to the peel angle setting plate 5 and is capable of carrying the translucent resin film 1d by sandwiching it between the moving conveyor belt 6B and the fixed conveyor belt 6A. The operation of sandwiching the translucent resin film 1d between the fixed and moving conveyor belts 6A, 6B is conducted through a cut 5A provided in the peel angle setting plate 5, as shown in FIG. 10. The cut 5A is designed to help the conveyor belts 6A, 6B sandwich the translucent resin film 1d whose peel position and angle have been set by the peel angle setting plate 5 when both the belts 6A, 6B reach the translucent resin film 1d. As a result, it is assured that the translucent resin film 1d is sandwiched between the fixed and moving conveyor belts 6A, 6B.

The fixed conveyor belt 6C consists of a roller 6Ca supported by the driving shaft II, a roller 6Cb supported by a driven shaft V and a belt 6c wound on rollers 6Ca, 6Cb.

The fixed conveyor belt 6D consists of a roller 6Da supported by the driven shaft IV, a roller 6Db supported by the driven shaft VI, a roller 6Dc rupported by a driven shaft VII, a roller 6Dd supported by a driven shaft VIII, a roller 6De supported by the driven shaft V and a belt 6d wound on rollers 6Da to 6De.

Figure 12:
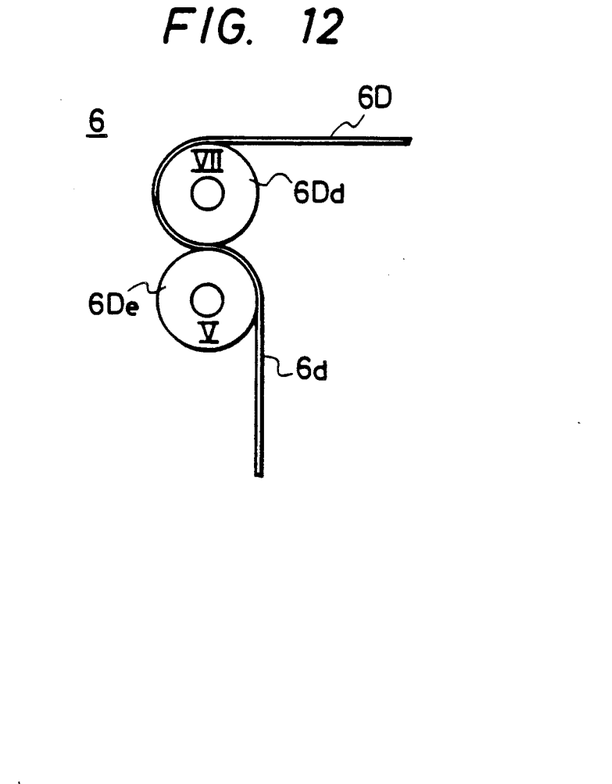
FIGS. 12 and 13 are sectional views of the principal portions of the film conveyance mechanism of FIG. 11.

The fixed conveyor belts 6C and 6D are so arranged as to further carry out the translucent resin film 1d carried out by the fixed and moving conveyor belts 6A and 6B. The roller 6De of the fixed conveyor belt 6D is intended to comply with the change of the conveyance direction at a large angle when the translucent resin film 1d is carried out from the fixed conveyor belts 6C, 6D to the fixed conveyor belts 6E, 6F, as shown in FIG. 12. In other words, the curvature radii of the belts 6c and 6d, on their surfaces contacting with the translucent resin film 1d at the position where the conveyance direction is changed, are made equal to each other by the roller 6De. Accordingly, the translucent resin film 1d is prevented from producing winkles and trouble such as a jam during conveyance.

Figure 13:
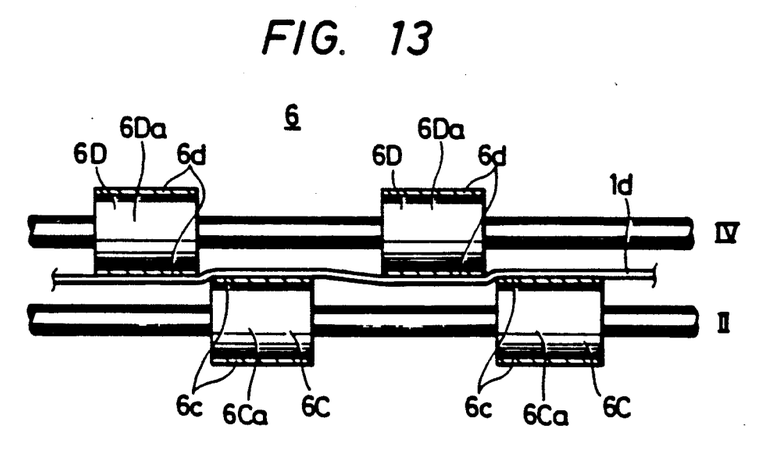

As shown in FIG. 13 (a partial sectional view), a plurality of fixed conveyor belts 6C (or 6D) brought in contact with one side of the translucent resin film 1d are installed at fixed intervals in the crosswise direction of the translucent resin film 1d crossing the conveyance direction. The fixed conveyor belts 6D (or 6C) brought in contact with the other side of the translucent resin film 1d is installed in between the plurality of the fixed conveyor belts 6C (or 6D). In other words, the fixed conveyor belts 6C, 6D are arranged in a staggered manner in the crosswise direction of the translucent resin film 1d so that surfaces of the belts 6c, 6d (the contacting faces with the translucent resin film 1d) are in a single plane, or otherwise the belts 6C, 6D bite into each other such that a plane formed by the surfaces of the belts 6c crosses the belts 6D and a plane formed by the surfaces of the belts 6d crosses the belts 6C.

Since the fixed conveyor belts 6C, 6D are thus arranged in a staggered manner, the translucent resin film 1d being carried out is supplied with tension in the crosswise direction thereof, so that the translucent resin film 1d can be sandwitched securely uniformly between the fixed conveyor belts 6C and 6D.

Moreover, the translucent resin film 1d sandwiched in between the fixed conveyor belts 6C, 6D is carried in such a form as to wrap the surfaces and sides of the belts 6c, 6d, respectively. In consequence, the rollers 6Ca, 6Cb, 6Da to 6De are not allowed to shift from the belts 6c and 6d in the axial direction of the rollers, respectively. The sandwiching force applied to the translucent resin film 1d during conveyance is thus uniformalized, whereas wrinkles and thus jamming are prevented from occurring. Since the thin film conveyance mechanism according to the present invention has a container 7A for containing the peeled upper translucent resin films conveyed by the upper conveyance belt mechanism and discharged, as will be described later, and the conveyance path of the upper conveyance belt mechanism is longer than the lower conveyance belt mechanism, it is effective to form the fixed conveyor belts 6C, 6D in such a manner as described above.

The fixed conveyor belt 6E consists of a roller 6Ea supported by a driven shaft IX, a roller 6Eb supported by the driven shaft V and a belt 6e wound on the rollers 6Ea, 6Eb.

The fixed conveyor belt 6F consists of a roller 6Fa supported by a driven shaft X, a roller 6Fb supported by the driven shaft VIII and a belt 6f wound by the rollers 6Fa, 6Fb.

As shown in FIGS. 1, 2, the fixed conveyor belts 6E and 6F are so arranged as to discharge the translucent resin film 1d carried by the fixed conveyor belts 6C and 6D from the apparatus body in the direction of an arrow M. The translucent resin film 1d discharged from the apparatus body is contained in the container 7A for containing the peeled upper translucent resin films discharged, as shown in FIG. 1. The container 7A for containing the peeled upper translucent resin films discharged is detachably mounted on the apparatus body, in its upper portion.

The lower conveyor belt mechanism comprises a fixed conveyor belt 6G and a moving conveyor belt 6H as shown in FIG. 2.

The fixed conveyor belt 6G consists of rollers 6Ga, 6Gc supported by a driven shaft (not shown) and a belt 6g wound on the rollers 6Ga to 6Gc.

The moving conveyor belt 6H consists of rollers 6Ha and 6Hc supported by different driven shafts (not shown), a roller 6Hb supported by a driven shaft (not shown) and a belt 6h wound on the rollers 6Ha to 6Hc.

The fixed conveyor belts 6G and the moving conveyor belt 6H carry a translucent resin film 1d peeled from the another side of the board, with peeling the film 1d whose peel position and angle are set by the peel angle setting plate 5 as in the case of the above-described upper conveyor belt mechanism. The conveyor belts 6G and 6H discharge the translucent resin film 1d from the apparatus body in the direction of an arrow O. The translucent resin film 1d discharged from the apparatus body is contained in a container 7B for containing the discharged lower translucent resin films as shown in FIG. 1. The container 7B for containing the discharged lower translucent resin films is detachably mounted on the apparatus body. Moreover, the container 7A for containing the discharged upper translucent resin films is installed above the container 7B so that area occupied by the containers 7A and 7B is reduced to thereby make the apparatus body compact.

As shown in FIGS. 2 and 11, a fluid spray mechanism 8 for sending a jet of fluid to the translucent resin film 1d being discharged in the direction of an arrow N is installed close to each of the conveyance paths on the discharge sides of the fixed conveyor belts 6E, 6F, and 6G and the moving conveyor belt 6H. The angle $\theta$, of the direction in which the fluid is sent out with respect to the translucent resin film 1d being discharged is acute ($0 \leq \theta_1 \leq 90$), to ensure that the translucent resin film 1d is led to the discharge direction by the jet of fluid. The fluid spray mechanism 8 comprises a pipe with outlets from which the fluid is jetted out, the outlets being proivded between the respective two conveyor belts 6E and 6E (6F and 6F, 6G and 6G and 6H and 6H) disposed adjacent to each other in the crosswise direction of the film 1d being carried crossing the conveyance direction. As the fluid, gas such as pressurized air or inert gas or the like and liquid such as water or the like may be used. A static eliminator (not shown) for reducing electrification of the translucent resin film 1d is installed close to the fluid sprayer 8.

By thus installing the fluid spray mechanism 8 on the discharge side of each of the fixed conveyor belts 6E, 6F, 6G and moving conveyor belt 6H, the translucent resin film 1d being discharged is prevented from being wound on the fixed conveyor belts 6E, 6F and 6G or moving conveyor belt 6H, and the translucent resin film 1d can can be led by the fluid in the direction of the arrow M or O. As a result, the translucent resin film 1d may be dischrged into the container 7A or 7B for containing the discharged upper or lower translucent resin film 1d efficiently.

Moreover, a roll-in preventing member 9 is installed close to the conveyance path on the discharge side, between the respective two conveyor belts 6E and 6E (6F and 6F, 6G and 6G and 6H and 6H) disposed adjacent to each other in the crosswise direction of the film 1d conveyed crossing the conveyance direction. Accordingly, the translucent resin film 1d is prevented from being wound on the fixed conveyor belts 6E, 6F, 6G or moving conveyor belt 6H.

As shown in FIG. 2, static eliminators 10 and ion dispersion devices 11 are installed close to the fixed conveyor belt 6A and the moving conveyor belt 6H, respectively. The static eliminator 10 is used to discharge ions in order that the static electrification of the translucent resin film 1d which occurs while the film 1d is peeled off or carried can be reduced. The ion dispersion device 11 disperses the ions discharged by the static eliminator 10, in order to efficiently reduce the static electrification of the film 1d. The device 11 disperses ions, using pressurized fluid such as air, for example.

The projected press member 3A of the projected press mechanism 3 may be wedge-shaped or plate-shaped instead of needle-shaped according to the present invention.

The present invention is applicable to a thin film conveyance apparatus for a thin film peeling apparatus equipped with a thin film raising mechanism for raising up the end of a translucent resin film 1D with a brush having a plurality of needles on the circumference of a rotary body.

The present invention is also applicable to a thin film delivery apparatus for a thin film peeling apparatus equipped with a thin film raising mechanism for pressing the end of a translucent resin film 1D with a knurled roller and raising that portion.

The present invention is further applicable to a thin film conveyance apparatus for an apparatus for peeling a protective film stuck to a decorative laminated sheet as building material.

Although the invention is described in its preferred from with a certain degree of particularity, it is believed obvious that various changes and modifications may be made in the invention without departing from the spirit and scope thereof.

As set forth above, the present invention has the following effects:

According to the present invention, film peeling apparatus has a film raising device for raising one end of the film stuck onto a base and a fluid injection device for peeling off the film from the base by sending a jet of fluid thereto. The fluid injection device comprises a fluid injection nozzle guide member for guiding the fluid injection nozzle so that the fluid may be injected from the injection nozzle directly toward the position where the end of the film is raised. Therefore, since the jet of fluid injected from the fluid injection nozzle can be directed to the film raising position in accordance with a thickness of the base and since the front end of the nozzle can be positioned as close to the film raising position as possible, the film can be peeled off surely and efficiently.

Moreover, the front end of the fluid injection nozzle and the base are prevented from contacting with each other, since the front end of the fluid injection nozzle can be moved or rotated to face the film raising position, corresponding to the thickness of the base. As a result, the front end of the fluid injection nozzle and the base are prevented from being damaged.

In the above description, the projected press device for raising a film is constructed as shown in FIG. 5. The projected press device may also be constructed as shown in FIGS. 14 through 18, as a second embodiment of the present invention. According to the second embodiment, the projected press member 3A has two finger portions 41 and 41 for raising the leading end of the film on the board. The projected press member 3A is slidably supported to a holding member 42 through fixedly secured to the support member (rotary shaft) 3C by two screw members 46. Two nut members 22 and 23 are threadedly provided on the projected press member 3A at its upper portion, as in the case of the projected press device shown in FIG. 5.

Figure 14:
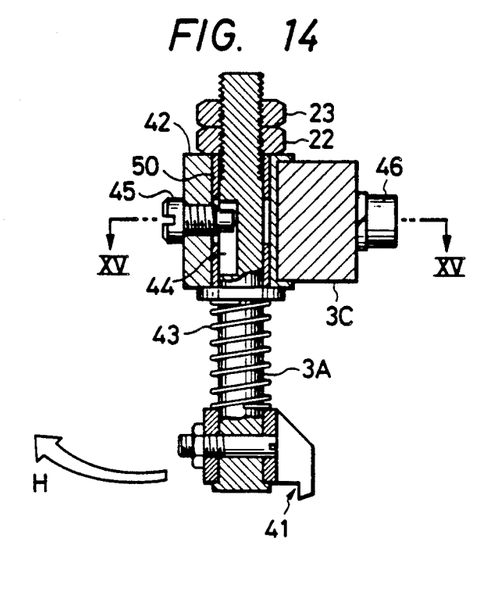
FIG. 14 is a sectional view showing a construction of a projected press device for raising a film, according to a second embodiment of the present invention.
Figure 15:
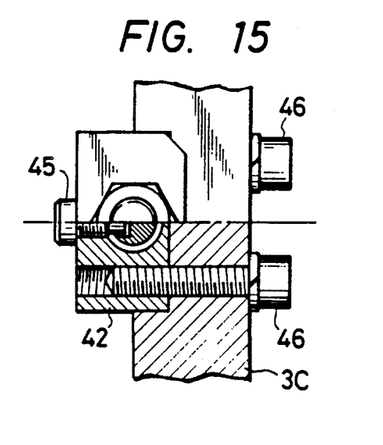
FIG. 15 is a partial cross sectional view of the projected press device of FIG. 14, along the line XV—XV.
Figure 18:
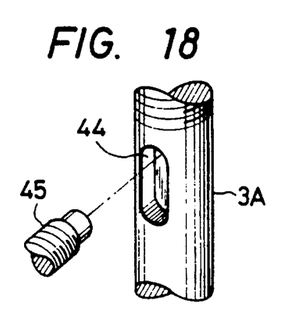
FIG. 18 is a perspective view showing a key slot of the press member of FIG. 14.

The projected press member 3A has a hole 44 for receiving a key screw 45 provided in the holding member 42. The projected press member 3A is prevented from rotating, since the key screw 45 is engaged in the key slot 44. A size of the key slot 44 is selected such that the press member 3A can slide in its axial direction but cannot rotate relative to the holding member 42.

When the support member (rotary shaft) 3C is rotated in a direction of an arrow H shown in FIG. 14, the projected press member 3A is angularly moved in the direction of the arrow H, so that the finger portions 41 may press and raise the end portion of the film on the board.

Figure 16:
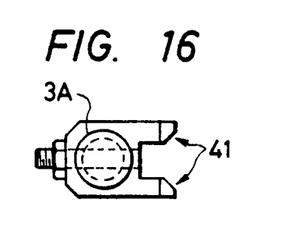
FIG. 16 is a plan view showing a construction of the finger portions of the projected press device of FIG. 14.
Figure 17:
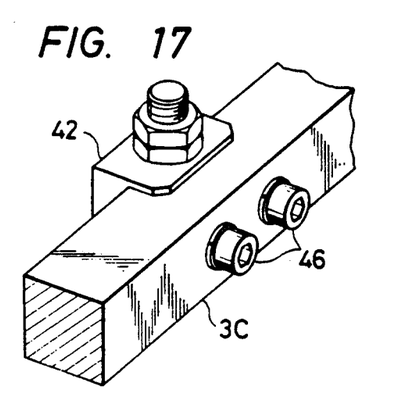
FIG. 17 is a perspective view showing the holding member of FIG. 14 fixed to the support member.

As described above, according to the second embodiment of the present invention, since the projected press member 3A has two finger portions 41 for raising the end portion of the film, the film can be raised without fail. Even if one of the finger portions 41 would enter into a positioning hole formed on the board, the other finger portion can raise the film end, to thereby peel the end portion of the film from the board.

I claim:

1. A film peeling apparatus comprising:
   a film raising device for raising an end portion of a film stuck onto a base;
   a fluid injection device for injecting a fluid to the film and peeling the film from the base, said fluid injection device having a fluid injection nozzle member for injecting the fluid in a forward direction to the end portion of the film raised by said film raising device and guide means for guiding said fluid injection nozzle member, said guide means having an end portion which is forward of said nozzle member, the end portion being contactable with the base so that the fluid injection of said nozzle member will be set to direct toward the raised end portion of the film, to thereby peel off the film from the base; and
   film discharging means for discharging the partially peeled film in cooperation with said fluid injection device to the outside, said film discharging means being located upstream of said film raising device.

2. A film peeling apparatus claimed in claim 1, wherein said fluid injection nozzle member is positioned downstream of the film raising device in a direction of conveyance of the base conveyance, and wherein said guide means guides said fluid injection nozzle member so that an angle formed by a surface of the base and a fluid injection direction of said fluid injection nozzle member may be acute.

3. A film peeling apparatus claimed in claim 1, wherein said nozzle guide member comprises means for moving said fluid injection nozzle member in correspondence with a thickness of the base.

4. A film peeling apparatus claimed in claim 3, wherein said fluid injection device further comprises a rotary support member for supporting said fluid injection means and said guide means.

5. A filmk peeling apparatus claimed in claim 3, wherein said guide means comprises a rod-shaped member.

6. A film peeling apparatus of claim 5, wherein said nozzle guide member further comprises a rotatable support member for supporting said injection nozzle member and said rod-shaped member whereby said support member rotates to make an end portion of said rod-shaped member contact the base so that a fluid injection hole of said fluid injection nozzle member will face the raised end portion of the film.

7. A film peeling apparatus claimed in claim 6, wherein said end portion of said rod-shaped member is tapered.

8. A film peeling apparatus claimed in claim 6, wherein said rod-shaped member has a threaded portion which is adapted to be screwed into a hole in said rotatable support member.

9. A film peeling apparatus claimed in claim 1, wherein said film raising device comprises a plurality of finger portions for raising the end portion of the film.

* * * * *